United States Patent [19]
Tichy

[11] Patent Number: 4,864,624
[45] Date of Patent: Sep. 5, 1989

[54] PIEZOELECTRIC LOUDSPEAKER WITH THERMAL PROTECTION

[76] Inventor: Thomas H. Tichy, 6400 Cranbrook St. N.E., Albuquerque, N. Mex. 87111

[21] Appl. No.: 175,001

[22] Filed: Mar. 30, 1988

[51] Int. Cl.[4] ....................... H03G 11/00; H04R 29/00

[52] U.S. Cl. ........................................ 381/55; 381/59; 381/111; 330/207 P

[58] Field of Search ............... 310/311, 322, 324, 325, 310/326; 381/55, 57, 59, 111, 190; 361/58; 330/207 P

[56] References Cited

U.S. PATENT DOCUMENTS

| | | | |
|---|---|---|---|
| 3,803,359 | 4/1974 | Corderman | 381/55 |
| 3,959,736 | 5/1976 | Grorjean | 381/55 |
| 3,965,295 | 6/1976 | Evans et al. | 381/55 |
| 4,296,278 | 10/1981 | Cullison et al. | 381/55 |
| 4,327,250 | 4/1982 | Von Recklinghausen | 381/55 |
| 4,401,857 | 8/1983 | Morikawa | 381/190 |

FOREIGN PATENT DOCUMENTS

| | | | |
|---|---|---|---|
| 0288599 | 12/1986 | Japan | 381/55 |

OTHER PUBLICATIONS

Poly PTC Current Protector, Midwest Components Inc., Oct. 1986.

*Primary Examiner*—Jin F. Ng
*Assistant Examiner*—David H. Kim

[57] ABSTRACT

A preferred embodiment of a thermal protection circuit for a piezoelectric speaker includes a PTC resistor connected in series with the speaker and a second PTC nonlinear resistive element, such as a light bulb, connected in parallel with the resistor. This protects the speaker from failure due to overheating caused by excessive drive signals without causing audio distortion during infrequent excessive drive signals of a short duration.

20 Claims, 1 Drawing Sheet

FIG. 1
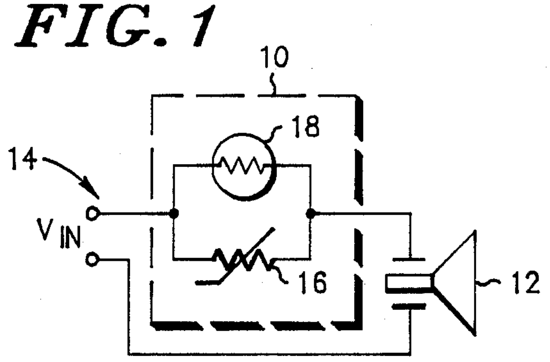
FIG. 3
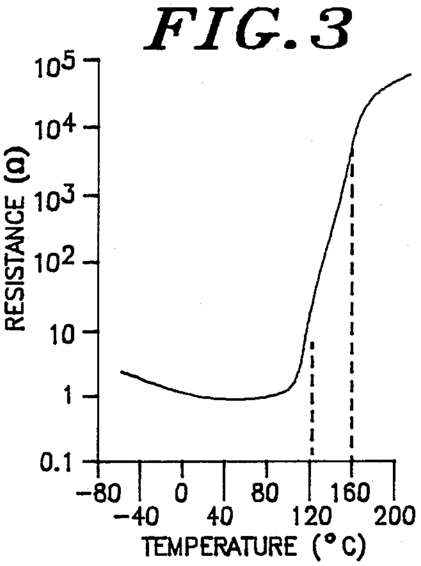
FIG. 2
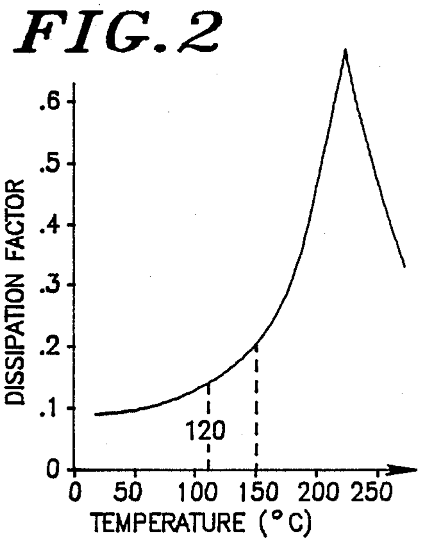
FIG. 4
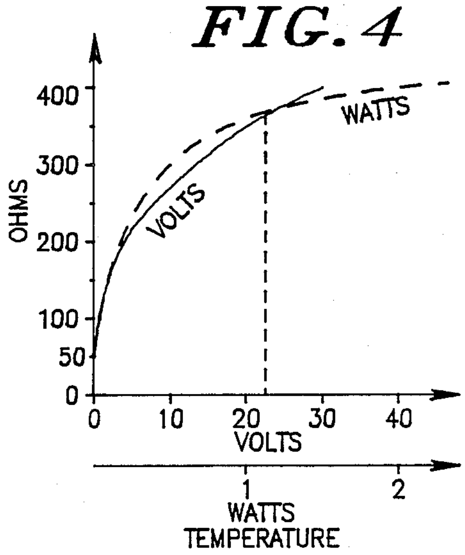
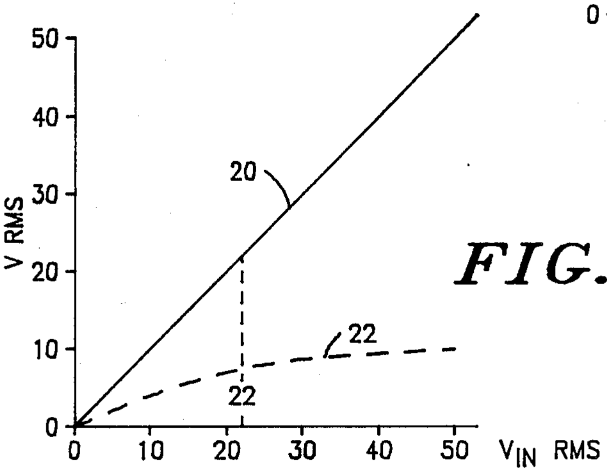
FIG. 5

PIEZOELECTRIC LOUDSPEAKER WITH THERMAL PROTECTION

BACKGROUND OF THE INVENTION

This invention is generally directed to piezoelectric speakers and more specifically to protecting same from failures due to overheating.

Piezoelectric speakers have response characteristics that differ substantially from conventional electromagnetic speakers Voice range and tweeter piezoelectric speakers have high frequency response characteristics that extend well beyond 20 kilohertz (kHz). Thus, any energy above the range of human hearing can contribute additional heat build-up in the piezoelectric driving element.

Excessive energy above the range of human hearing may be delivered to a speaker when the audio power amplifier stage is driven beyond its linear power handling capabilities and goes into a nonlinear or "clipping" region. Such action produces harmonics and other nonlinear signals above 20 kHz which contributes to an undesired heating of a piezoelectric speaker.

It is also possible for very high power audio amplifiers which are not driven into a nonlinear region to provide an amount of power beyond the power handling capability of the piezoelectric speaker. This produces excessive thermal heating in the piezoelectric driving element.

Conventional electromagnetic speakers do not encounter the same heating problems due to high frequency energy above 20 kHz. This is because these speakers appear somewhat inductive and thus have an impedance which increases as the frequency increases. The higher impedances at the higher frequencies tend to limit the power accepted at the high frequencies. Of course, high levels of energy below 20 kHz can lead to thermal problems in electromagnetic speakers. In order to limit the power delivered to electromagnetic speakers, various elements have bee connected in series with the speaker including nonlinear resistors.

The excessive heat dissipation problem encountered by piezoelectric speakers has been addressed by using a series resistor Parallel zener diodes connected back-to-back in series with a resistor have been connected in parallel across the speaker terminals in order to limit the voltage which can appear across the speaker. Although the zener diode combination is effective in limiting the voltage and hence energy which can be applied to a piezoelectric speaker, it significantly degrades the audio performance of the speaker since even infrequent high volume passages will be limited. Normally, intermittent high volume passages will not adversely effect a piezoelectric speaker since significant heat in the piezoelectric driver element will not develop. Excessive thermal overloading of a piezoelectric speaker results in irreversible damage and often total failure.

It is an object of the present invention to provide a piezoelectric speaker with improved thermal protection which minimizes audio quality degradation.

BRIEF DESCRIPTION OF THE DRAWINGS

FIG. 1 is a schematic illustrating an embodiment of the present invention.

FIG. 2 is a graph illustrating the power dissipation in a piezoelectric speaker versus temperature.

FIG. 3 is a graph illustrating the resistance versus temperature characteristic of a positive temperature coefficient (PTC) resistor utilized in a preferred embodiment of the present invention.

FIG. 4 is a graph which illustrates the voltage/power versus resistance characteristics for a light bulb utilized in a preferred embodiment of the present invention.

FIG. 5 is a graph illustrating RMS voltage across the piezoelectric speaker versus applied driving voltage in accordance with a preferred embodiment of the present invention.

DETAILED DESCRIPTION

FIG. 1 is a schematic which illustrates a preferred embodiment of the present invention which includes a nonlinear resistive network 10 connected in series with a piezoelectric speaker 12 which is driven by an applied voltage across terminals 14. The network 10 includes a resistive element 16 having a nonlinear resistance versus temperature characteristic and preferably comprises a PTC resistor. A resistive element is connected in parallel with element 16 and preferably has a nonlinear resistance versus temperature characteristic different from that of element 16. In the preferred embodiment, element 18 comprises a incandescent light bulb.

An understanding of the thermal characteristics of a typical piezoelectric speaker 12 will facilitate an understanding of how element 16 and 18 cooperate to form a network 10 which provides effective thermal protection for the speaker while maintaining audio quality. FIG. 2 illustrates the dissipation factor for a 0.13 mm thick ×31.7 mm diameter piezoelectric bimorph wafer measured at 10 kHz. It will be seen that the dissipation factor increases at a nonlinear rate up to approximately 220° C. The dissipation factor increases rapidly at temperatures above 150° C. and thus creates a positive feedback or runaway thermal condition for temperatures exceeding 150° C. The goal of protection network 10 is to limit the average power being dissipated by piezoelectric speaker 12 so that the temperature of the piezoelectric driving element does not exceed about 120° C.

FIG. 3 illustrates the nonlinear resistance versus temperature characteristic of a preferred PTC resistor 16. The resistance is relatively constant for temperatures below 120° C. The resistance increases rapidly as temperature increases from 120° C. to 150° C. Ignoring the operation of element 18, the rapidly increasing series resistance presented by element 16 as its temperature increases beyond 120° C. causes substantially more voltage to be developed across element 16 and reduces the voltage across speaker 12 thereby limiting the thermal dissipation by the speaker. The $I^2R$ power dissipated by resistor 16 is the primary factor responsible for increasing its temperature. PTC resistor 16 has a relatively slow thermal rise time (4–8 seconds) for it to reach 120° C. from nominal room temperature in response to an application of a drive voltage to terminals 14 which exceeds the piezoelectric speaker rating by a factor of two. Thus, minor transient increases in power beyond the design of the piezoelectric speaker 12 will not result in power limiting and audio degradation. Such operation makes the network 10 nonresponsive to short time durations of excessive power which may occur during certain programing material This lets the piezoelectric speaker 12 operate in its normal mode under such conditions.

The graph in FIG. 4 illustrates the resistance versus voltage/power characteristic of an incandescent light bulb #376. This bulb has a cold to hot resistance range of 1:10, i.e., 50 to 500 ohms. At approximately 22 volts the bulb has an ON resistance of about 350 ohms. The thermal rise time of the bulb is substantially faster than element 16; the bulb has a time constant of less than 0.5 seconds.

The general purpose of bulb 18 is to limit the maximum resistance provided by network 10 as the resistance of element 16 increases due to excessive drive voltage so that the drive to speaker 12 is not completely cut off during periods of over drive voltage. Since the room temperature resistance of PTC element 16 compared to the room temperature resistance of bulb 18 is 1:3, it is apparent that the resistance of the PTC resistor dominates the network 10 at temperatures below 120° C. The room temperature to hot resistance of the PTC element 16 is at least 1:500 while the room temperature to hot resistance of bulb 18 is approximately 1:10. Thus, it will be apparent that with increasing temperature the resistance of the PTC resistor will overtake the light bulb resistance and cause the latter to dominate the resistance of the network.

FIG. 5 illustrates a graph of RMS voltage across piezoelectric speaker 12 versus input voltage applied across terminals 14. The voltage across the speaker will follow solid line curve 20 when the temperature of the PTC resistor 16 is below 120° C. It will be seen that curve 20 illustrates a linear function of voltage across the speaker versus input voltage. A line representing an applied voltage of 22 volts is indicated since, for the particular PTC resistor 16 selected, this voltage will cause heating sufficient to cause the temperature of the PTC resistance to go above 120° C. if this voltage is maintained for approximately 4 seconds.

For example, if the speaker were used in an audio system in which the user rapidly turned up the power such that the voltage applied across the speaker increased along curve 20 higher than the 22 volt of applied voltage point, then after approximately 4 seconds, the voltage across the speaker would rapidly drop in a hysteresis transition down to the corresponding operating point on dashed line curve 22 which represents the temperature of the PTC resistor 16 having exceeded 120° C. If the applied power was rapidly turned down, the voltage across speaker 12 would decrease following dashed line 22 and move toward 0 volts. If maintained in the region below 22 volts of input power for a time long enough for the thermal coefficient of the PTC to allow it to fall below 120° C., a hysteresis transition would occur and the operating point would move from curve 22 to curve 20. The curve shown in FIG. 5 represents a 1.25 inch bimorph piezoelectric driver with an applied audio voltage having a frequency of 2 kHz. The input voltage at which the PTC will reach a temperature of greater than 120° C. will vary with input voltages at different frequencies.

It will be apparent that the normal operating voltage for speaker 12 is at less than 22 volts. Brief voltage increases beyond the PTC trigger voltage will not cause voltage limiting to the speaker because of the thermal delay required to heat the PTC resistor to above 120° C. This provides thermal protection without voltage limiting transient voltage excursions. This provides a greatly improved audio response compared to other methods in which voltage limiting is fixed to a predetermined voltage.

Another aspect of the present invention is that bulb 18 provides a visual indication that protection network 10 is active and that excessive drive voltage is being applied to piezoelectric speaker 12. Mounting bulb 18 at a location which can be seen by the user provides such a visual indication and will allow an adjustment of the drive level. Of course an automatic control circuit using an optical sensor could be easily implemented.

Although a preferred embodiment of the present invention has been described and shown in the drawings, the scope of the present invention is defined by the claims which follow.

What is claimed is:

1. A speaker system comprising:

a piezoelectric speaker responsive to audio signals; and means connected in series with said speaker for protecting said speaker from thermal failure due to audio signals which exceed the power rating of the speaker, said protecting means including a positive temperature coefficient (PTC) resistor connected in series with said speaker and a PTC nonlinear resistive device connected in parallel with said PTC resistor.

2. The system according to claim 1 wherein said PTC resistor has a first resistance below a trigger temperature and a second resistance greater than said first resistance above said trigger temperature, said PTC device having a range of resistance ranging from a minimum resistance which is greater than said first resistance to a maximum resistance which is less than said second resistance.

3. The system according to claim 2 wherein said PTC resistor is selected so that said trigger temperature is reached prior to said speaker having a thermal failure.

4. The system according to claim 3 wherein said PTC resistor has a thermal rise time such that transient audio signals of excessive magnitude do not cause said PTC resistor to reach said trigger temperature.

5. The system according to claim 2 wherein said PTC resistor has a thermal rise time such that transient audio signals of excessive magnitude do not cause said PTC resistor to reach said trigger temperature.

6. The system according to claim 1 wherein said PTC device comprises an incandescent light bulb.

7. The system according to claim 2 wherein said PTC device comprises an incandescent light bulb.

8. The system according to claim 1 wherein said PTC device provides visual indicia of excessive audio signals.

9. The system according to claim 6 wherein said PTC device provides visual indicia of excessive audio signals.

10. A means for protecting a piezoelectric speaker from thermal failure due to driving the speaker with audio signals of excessive magnitude comprising:

a positive temperature coefficient (PTC) resistor for connection in series with said speaker; and PTC nonlinear resistive device connected in parallel with said PTC resistor.

11. The protecting means according to claim 10 wherein said PTC resistor has a first resistance below a trigger temperature and a second resistance greater than said resistance above said trigger temperature, said PTC device having a range of resistance ranging from a minimum resistance which is greater than said first resistance to a maximum resistance which is less than said second resistance.

12. The protecting means according to claim 11 wherein said PTC resistor is selected so that said trigger temperature is reached prior to said speaker having a thermal failure.

13. The protecting means according to claim 12 wherein said PTC resistor has a thermal rise time such that transient audio signals of excessive magnitude do not cause said PTC resistor to reach said trigger temperature.

14. The protecting means according to claim 11 wherein said PTC resistor has a thermal rise time such that transient audio signals of excessive magnitude do not cause said PTC resistor to reach said trigger temperature.

15. The protecting means according to claim 10 wherein said PTC device comprises an incandescent light bulb.

16. The protecting means according to claim 11 wherein said PTC device comprises an incandescent light bulb.

17. The protecting means according to claim 10 wherein said PTC device provides visual indicia of excessive audio signals.

18. The protecting means according to claim 15 wherein said PTC device provides visual indicia of excessive audio signals.

19. A method for protecting a piezoelectric speaker against thermal failure due to being driven by audio signals of excessive magnitude comprising the steps of:

limiting the audio voltage applied to said speaker to within the power handling capability of said speaker when excessive magnitude audio signals are present for a predetermined time period by the use of a protection circuit connected in series with said speaker, said limiting not being responsive to infrequent transient audio signals that are excessive; and controlling the amount of said limiting so that said speaker is continuously supplied with audio signals of substantial drive level but within the power handling capability of said speaker even when excessive magnitude audio signals are present.

20. The method according to claim 19 further comprising the step of providing a visual indication that said limiting is occurring.

* * * * *